United States Patent
Weir et al.

(10) Patent No.: US 11,939,215 B2
(45) Date of Patent: Mar. 26, 2024

(54) MICROELECTROMECHANICAL STRUCTURE INCLUDING A FUNCTIONAL ELEMENT SITUATED IN A CAVITY OF THE MICROELECTROMECHANICAL STRUCTURE

(71) Applicant: Robert Bosch GmbH, Stuttgart (DE)

(72) Inventors: Penny Weir, Reutlingen (DE); Markus Kuhnke, Wannweil (DE); Stefan Majoni, Weil Im Schoenbuch (DE)

(73) Assignee: ROBERT BOSCH GMBH, Stuttgart (DE)

( * ) Notice: Subject to any disclaimer, the term of this patent is extended or adjusted under 35 U.S.C. 154(b) by 449 days.

(21) Appl. No.: 17/266,482

(22) PCT Filed: Oct. 4, 2019

(86) PCT No.: PCT/EP2019/076907
§ 371 (c)(1),
(2) Date: Feb. 5, 2021

(87) PCT Pub. No.: WO2020/078739
PCT Pub. Date: Apr. 23, 2020

(65) Prior Publication Data
US 2021/0229986 A1    Jul. 29, 2021

(30) Foreign Application Priority Data
Oct. 18, 2018    (DE) .......................... 102018217894.1

(51) Int. Cl.
*B81C 1/00* (2006.01)
*B81B 3/00* (2006.01)

(52) U.S. Cl.
CPC ........ *B81C 1/00698* (2013.01); *B81B 3/0018* (2013.01); *B81B 2201/0271* (2013.01); *B81C 2203/0145* (2013.01)

(58) Field of Classification Search
CPC ............ B81C 1/00698; B81C 1/00269; B81C 2203/0145
See application file for complete search history.

(56) References Cited

U.S. PATENT DOCUMENTS

| 10,676,349 | B1* | 6/2020 | Grosjean .............. H03H 9/1057 |
| 2008/0122020 | A1 | 5/2008 | Metz et al. |
| 2018/0107854 | A1* | 4/2018 | Tsai ...................... B06B 1/0666 |
| 2018/0257929 | A1 | 9/2018 | Daneman et al. |

FOREIGN PATENT DOCUMENTS

| CN | 104094399 A | 10/2014 |
| CN | 104860258 A | 8/2015 |
| CN | 106044701 A | 10/2016 |

OTHER PUBLICATIONS

International Search Report for PCT/EP2019/076907, dated Jan. 16, 2020.

* cited by examiner

Primary Examiner — Moazzam Hossain
(74) Attorney, Agent, or Firm — NORTON ROSE FULBRIGHT US LLP; Gerard A. Messina

(57) ABSTRACT

A microelectromechanical structure, including a functional element situated in a cavity of the microelectromechanical structure. The functional element includes an aluminum nitride layer. The cavity is closed by a cap layer. The cap layer includes epitaxial silicon. A method for manufacturing a micromechanical structure is also described.

9 Claims, 1 Drawing Sheet

MICROELECTROMECHANICAL STRUCTURE INCLUDING A FUNCTIONAL ELEMENT SITUATED IN A CAVITY OF THE MICROELECTROMECHANICAL STRUCTURE

FIELD

The present invention is directed to a microelectromechanical structure and a method for manufacturing the microelectromechanical structure.

BACKGROUND INFORMATION

Microelectromechanical systems (MEMS) having layered structures are conventional in the related art in various specific embodiments. Such systems are used as sensors or actuators, for example, to convert mechanical movements and electrical signals into one another. A technologically particularly highly promising approach is the combination of silicon layers with one or multiple piezoelectric or piezoresistive functional layer(s), whose cooperation opens up new options for the design of the electromechanical properties of the components.

Micromechanical silicon structures are usually created by an interplay of alternating material deposition and removal. For this purpose, layers having a defined thickness are generated in a targeted manner on a substrate, for example by physical or chemical vapor deposition, into which trenches are etched in a subsequent step. The desired microstructure is thus formed by a sequence of multiple deposition and etching steps. To shield the microelectromechanical structure thus generated against outside influences, a silicon cap is applied using conventional methods onto the structure by epitaxial deposition, so that the structure is sealed in a cavity against the exterior space.

The use of additional functional layers, such as aluminum nitride for example, with this form of cap formation results in the technical problem that the epitaxially deposited silicon grows at least partially on the aluminum nitride layer and in this way, for example, an undesirable electrically conducting connection of the adjoining layers separated by the aluminum nitride layer is established. During the use of aluminum in epitaxial manufacturing methods for silicon components, in principle, there is additionally the risk that aluminum is deposited in an uncontrolled manner on the surfaces of the epitaxial system and results in contamination and equipment damage.

SUMMARY

It is an object of the present invention to provide a microelectromechanical structure in which an aluminum nitride-containing functional element is shielded against the exterior space.

In the microelectromechanical structure in accordance with an example embodiment of the present invention, the cavity including the functional element is closed by an epitaxially formed layer made up of silicon. Such a cap layer (epi cap) considerably enhances the quality and reliability of the micromechanical structure. As a result of the microelectromechanical structure according to the present invention, it is advantageously possible to provide protection for micromechanical systems, such as e.g., for resonators, rotation rate sensors, acceleration sensors, fingerprint sensors, energy harvesters, actuators, etc.

The epitaxial silicon layer is preferably made up of polycrystalline silicon, a cap made up of pure crystalline or of a mixture of polycrystalline and pure crystalline silicon also being possible. The functional element is preferably suspended inside the cavity via connections to the remainder of the microelectromechanical structure.

The geometry of the aluminum nitride layer is hereafter also described by the terms "lateral" or horizontal (i.e., in parallel to the main extension plane of the layer) or vertical (i.e., perpendicular to the main extension plane of the layer). The main extension plane of the layer usually also corresponds to the main extension plane of the substrate of the microelectromechanical structure, however, other orientations also being possible.

Advantageous example embodiments of the present invention are described herein.

According to one preferred specific embodiment of the present invention, the aluminum nitride layer includes at least one exposed surface area, the exposed surface area being exposed inside the cavity.

According to one further preferred specific embodiment of the present invention, the at least one exposed surface area of the aluminum nitride layer has a width of maximally 2.5 μm. According to one further preferred specific embodiment of the present invention, the width is less than 2.5 μm. Hereafter, the width shall be understood to mean the dimension of the surface area along the direction of minimal extension. In the case of a microelectromechanical layer structure, such exposed surface areas are usually generated by removing the material surrounding the aluminum nitride layer and/or by removing portions of the aluminum nitride layer itself. This typically results in relatively simple geometric shapes of the exposed surface area, such as, in particular, rectangles, however more complex shapes also being possible. If, for example, an aluminum nitride layer surrounded by silicon is cut in a planar manner perpendicularly to its main extension plane, a strip having a width which is provided by the thickness of the aluminum nitride layer results as the exposed surface area. If multiple surface areas of the aluminum nitride layer are exposed, the width of each individual surface area is preferably maximally 2.5 μm or less than 2.5 μm.

Surprisingly, it has been found that the growth of silicon is suppressed within the following meaning on a surface area having a width of maximally 2.5 μm or less than 2.5 μm: To grow directly on the exposed aluminum nitride surface area, the silicon atoms have to be vapor deposited on the surface area or be reactively generated from the gas phase. In the process, two competing processes may be assumed. On the one hand, the undesirable silicon formation on the aluminum nitride ("AlN"). On the other hand, the silicon formation on silicon, which requires a transport process of the forming silicon across the surface or the gas phase. However, the transport of the gaseous starting product from the AlN surface to the silicon would also be possible. Whether silicon deposits on aluminum nitride thus depends on the length of the transport path, and thus on the width of the AlN surface area. At a width of 2.5 μm, it is ensured that the silicon, or the silicon-forming gas, is transported to the edges of the exposed surface area, or only grows there, so that the surface area tends to grow over from the edges, and the overgrowth of the exposed surface area progresses considerably more slowly than in the case of a direct nucleation of the silicon layer on the aluminum nitride surface area. A width of 2.5 μm or less than 2.5 μm has proven to be optimal for the temperature ranges relevant for the manufacturing process. If the diffusion length is particularly large or small due to special circumstances, it is alternatively also possible to select the width of the exposed surface area to be accordingly larger or smaller. In any case, the width of the exposed surface area should preferably be smaller than the diffusion length. It is also possible to select the width to be maximally 10%, 25% or 50% of the diffusion length. In this way, it is possible to advantageously prevent the overgrowth of the exposed surface area of the aluminum nitride layer by the dimensions of the exposed layer. It is sufficient in the process to prevent the overgrowth until the openings through which new silicon is able to flow to the aluminum nitride layer are closed by the epitaxial process.

According to one further preferred specific embodiment of the present invention, the thickness of the aluminum nitride layer tapers toward an edge of the functional element. The edge of the functional element in this connection shall be understood to mean one or multiple surface(s) of the functional element which is or are exposed inside the cavity. In the process, one or multiple of these exposed surfaces intersect(s) the aluminum nitride layer and thus include(s) one or multiple exposed surface area(s) of the aluminum nitride layer. For the suppression of the growth of silicon on the exposed surface area of the aluminum nitride layer, it is provided according to one preferred specific embodiment of the present invention that the width of the exposed surface area is 2.5 µm or less. In the simplest case, this may be achieved in that the aluminum nitride layer itself has a maximum thickness of 2.5 µm or less. If it should be advantageous or necessary for the function of the component to select the thickness to be greater, it is nonetheless possible to reduce the width of the exposed surface area in relation to the thickness by configuring the aluminum nitride layer in such a way that its thickness tapers toward the edge of the functional element in such a way that the tapered portion at the edge includes an exposed surface area having a width of 2.5 µm or less. An aluminum nitride layer thus tapering is preferably generated during the manufacture of the microelectromechanical structure in that initially an aluminum nitride layer having a constant thickness is deposited, and this layer is removed in a subsequent step in a targeted manner in such a way that the thickness is accordingly decreased in the areas which later form the edge of the functional element. Such a targeted removal may, for example, be implemented with the aid of ion beam trimming (IBT). This method is used, for example, during the manufacture of semiconductor components for achieving a highly homogeneous layer thickness by precise local processing of the layer surface. As a result of a greater or lesser local removal which is controlled in a targeted manner, it is also possible to create surface topographies in this way in which the thickness varies in a highly precisely settable manner across the lateral extension of the layer.

According to one further preferred specific embodiment of the present invention, the layer made up of aluminum nitride includes an insulating layer at an edge of the functional element. To prevent the overgrowth of the aluminum nitride layer, and thus a short circuit of the layers resting against the aluminum nitride layer, the aluminum nitride layer, at the edge of the functional element, may be provided with an insulating layer on which the silicon grows only poorly or not at all. In the process, the insulating layer covers the formerly exposed surface area of the aluminum nitride layer and itself includes one or multiple surface area(s) which is/are exposed in the cavity. If the growth of silicon on the exposed surface area is completely suppressed or drastically slowed, the silicon atoms deposited on the exposed surface area of the insulating layer migrate to the layers resting thereagainst so that the surface area, at the most, grows over from the edges, and the overgrowth of the exposed surface area is drastically slowed compared to a direct growth of a silicon layer on the insulating layer. In the process, the insulating layer may cover the surface area of the aluminum nitride layer which is exposed in the cavity and/or at least a portion of the abutting layers. The exposed surface area of the aluminum nitride layer may extend in the form of a closed strip over a circumference of the functional element. In this case, the insulating layer is preferably designed as a band or a ring, which extends completely around the circumference of the functional element and covers the aluminum nitride layer.

According to one further preferred specific embodiment of the present invention, the insulating layer includes silicon oxide and/or silicon nitride and/or silicon-rich nitride. In the case of silicon nitride ($Si_3N_4$), nitrogen and silicon are present at a stoichiometric ratio of 1.33, while silicon-rich nitride involves compounds in which the ratio of nitrogen to silicon is below 1.2. It has been found that the growth of the silicon on the insulating layer may be effectively prevented through the use of these materials. The insulating layer is preferably completely made up of silicon oxide or silicon nitride or silicon-rich nitride, however it also being possible that the insulating layer includes areas made up of one of the three materials and further areas made up of another of the three materials. The insulating layer is preferably present as amorphous silicon oxide and/or amorphous silicon nitride and/or amorphous silicon-rich nitride.

According to one further preferred specific embodiment of the present invention, the aluminum nitride layer is doped with scandium. The addition of scandium results in an improvement of the piezoelectric properties (in particular, in an increase in the piezoelectric coefficient) of the aluminum nitride, and thus in an increase in the performance capability of the microelectromechanical structure.

According to one further preferred specific embodiment of the present invention, the functional element includes a first silicon layer and a second silicon layer, the aluminum nitride layer being situated between the first and second silicon layers. In such a silicon-aluminum nitride-silicon sandwich structure, the two silicon layers may, for example, be used as electrodes, with the aid of which an external voltage is applied to the aluminum nitride layer or also a piezoelectrically generated voltage is tapped. In the process, the lateral edge of the aluminum nitride layer may, for example, form a surface area, which is exposed in the cavity, in the form of a rectangular strip between the exposed surface area of the two silicon layers, or also be covered by an insulating layer, which prevents the growth of silicon during the epitaxial deposition.

According to one further preferred specific embodiment of the present invention, the functional element includes at least one further layer, the at least one further layer including a metal and/or a metallic compound and/or a combination of silicon and a metal and/or a combination of silicon and a metallic compound. The at least one further layer preferably includes one or multiple highly conductive material(s), such as metals, metal silicides or metal nitrides. The at least one further layer may be made up completely of such a highly conductive material, made up of a combination of multiple highly conductive materials, or made up of a combination of one or multiple highly conductive material(s) and silicon. The at least one further layer particularly preferably includes molybdenum and/or tungsten and/or tungsten silicide. The at least one further layer may be situated above or beneath (based on the direction perpendicular to the main extension plane of the aluminum nitride layer) the aluminum nitride layer and, in particular, directly abut the aluminum nitride layer. According to one particularly preferred specific embodiment, the at least one further layer is situated beneath the aluminum nitride layer and, in particular during the manufacturing process, forms a substrate, for example made up of molybdenum or platinum, for the aluminum nitride layer growing thereon. According to one further preferred specific embodiment, the at least one further layer is completely embedded into a silicon layer, so that the highly conductive material is completely surrounded by silicon. For example, the at least one further layer may be made up of tungsten silicide or another highly conductive material. According to one particularly preferred specific embodiment, the functional element includes at least two further layers of the aforementioned type. In the process, the first of these two layers may, in particular, be situated beneath the aluminum nitride layer, while the second layer is situated above the aluminum nitride layer. For example, one or both silicon layer(s) of a silicon-aluminum nitride-silicon sandwich structure may include a core made up of a highly conductive layer, or one or multiple highly conductive layer(s) may be situated between a silicon layer and the aluminum nitride layer. In this way, the conductivity of the silicon layer may advantageously be increased, or the electromechanical behavior of the functional element may be modified in a targeted manner.

According to one further preferred specific embodiment of the present invention, the functional element is an electromechanical resonator. The resonator preferably includes a silicon-aluminum nitride-silicon sandwich structure, in which a piezoresistive functional layer made up of aluminum nitride is situated between two horizontally situated silicon electrodes. As a result of the epitaxially applied cap layer, the cavity is closed against the exterior space, and the functional element is thus hermetically sealed from the surroundings. The resonator is preferably connected by suspensions to the remainder of the microelectromechanical structure and is mounted oscillatorily with respect thereto. Due to the embedding in the closed cavity, the robustness and reliability of the microelectromechanical structure may be considerably increased. Possible applications for such a resonator structure are the use as a highly precise clock-pulse generator in watches or highly clocked electronic communication devices, such as WiFi, CAN/LIN, Bluetooth or NLC. In addition to aluminum nitride and silicon, the functional element may include further materials, in particular include one or multiple further layer(s) made up of one of the above-described highly conductive materials. It is also possible that the electrodes are made up of another material instead of silicon, such as for example tungsten, titanium, titanium nitride or aluminum.

Another object of the present invention is to provide a method for manufacturing the micromechanical structure according to the present invention. In the process in accordance with an example embodiment of the present invention, a cavity including a functional element which includes an aluminum nitride layer is closed by epitaxially growing on a cap layer. The formation of the cap layer preferably takes place in two steps, in the first step a first portion of the cap layer grows on a sacrificial layer covering the functional element. After openings have been etched into the first portion of the cap layer, the sacrificial layer is at least partially removed by a further etching process, and the material surrounding the functional element is removed, so that a cavity including the functional element arises. In a second step, further silicon is grown on the first portion of the cap layer until the openings of the cap layer are closed.

The method may furthermore include a suitable pretreatment of the wafer, such as for example a cleaning using hydrofluoric acid (HF) and, if necessary, a further optimized configuration of the micromechanical structure. In this way, for example, the accesses at the closure point may be designed to be particularly long and narrow to make it more difficult for the epitaxially deposited silicon to access the aluminum nitride layer. The amount of penetrating silicon is essentially determined by the cross-sectional surface area of the openings. However, since the deposited silicon grows over a narrow, long opening, at the same cross-section, more quickly, the penetration of silicon may be further reduced by the geometric shape of the opening cross-section.

DETAILED DESCRIPTION OF EXAMPLE EMBODIMENTS

Figure 1:
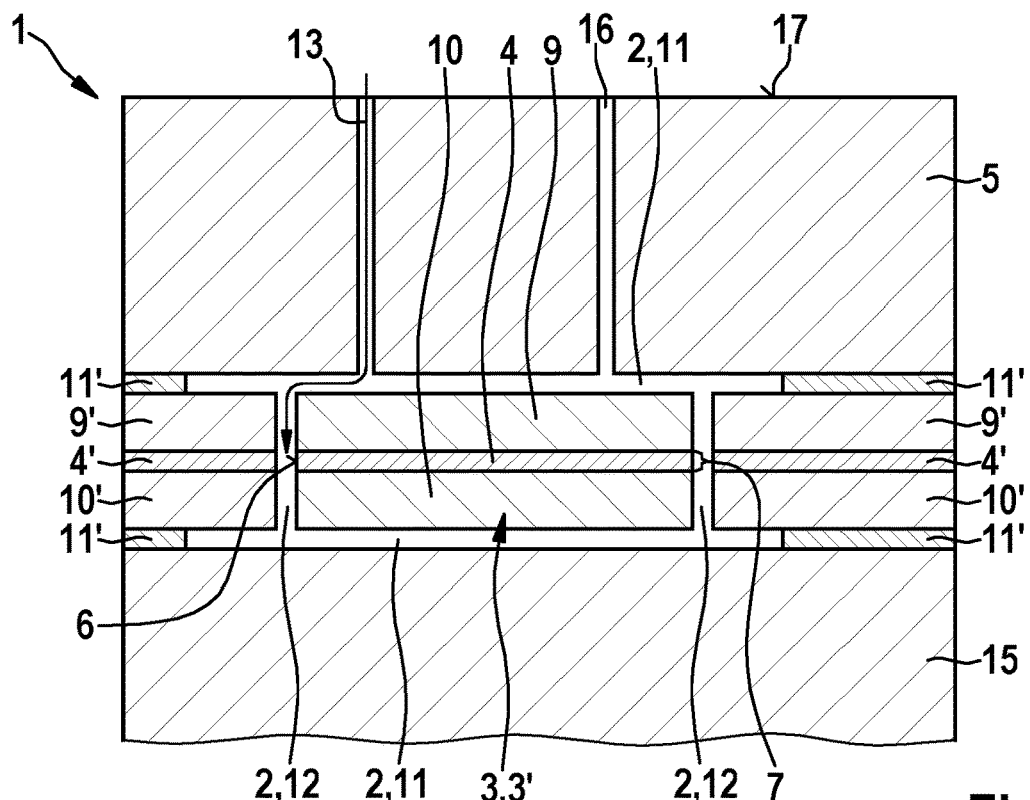
FIG. 1 shows a specific embodiment of the microelectromechanical structure according to the present invention during the growth of an epitaxial cap layer to illustrate the technical problem underlying the present invention.

FIG. 1 shows a microelectromechanical structure 1 in a schematic sectional illustration, based on which the problem underlying the present invention is outlined hereafter. Functional element 3 is the functional core of microelectromechanical structure 1, in the present case a resonator 3' including a sandwich structure, which is formed by a first (lower) silicon layer 10 and a second (upper) silicon layer 9, between which an aluminum nitride layer 4 is situated. Silicon layers 10, 9 act as electrodes, with the aid of which a voltage may be applied to functional aluminum nitride layer 4 or tapped. Resonator 3' is situated in a cavity 2, it being oscillatorily connected to the remainder of microelectromechanical structure 1 via suspensions (not shown). The cavity is formed by essentially vertically extending recesses 12, which surround functional element 3 in the lateral direction, and by two essentially horizontally extending recesses 11, which surround functional element 3 from above and beneath. The terms "vertical" and "horizontal" refer to the directions visible in the schematic sectional illustration, both recesses 11, 12, of course, also including extensions extending perpendicularly to the drawing plane.

The manufacture of functional element 3 exposed in cavity 2 takes place in multiple steps by applying and removing material in a targeted manner with the aid of epitaxy and etching processes. In the process, the horizontally extending recesses 11 are usually generated by the application of sacrificial layers, for example made up of silicon oxide, which in a subsequent step are at least partially removed again by etching, so that the horizontally extending recesses 11 form. The illustration shows remainders 11' of two sacrificial layers remaining after the etching process, of which the lower is directly applied to the carrier wafer, and the upper deposited after the second silicon layer 9. A first silicon layer 10, 10', a functional layer 4, 4' made up of aluminum nitride (having a thickness of 1 µm) and an upper silicon layer 9, 9' are consecutively applied onto the lower sacrificial layer. In a subsequent step, trenches 12 are etched, for example by deep reactive ion etching, which define the lateral shape of functional element 3 and separate the two silicon layers 10, 9 and aluminum nitride layer 4 of functional element 3 from layer portions 10', 9' and 4' situated outside functional element 3. The trenches are subsequently filled with sacrificial material, and the multi-layer system thus formed is provided with an epitaxially grown silicon layer 5 (having a thickness of 18 μm). Thereafter, openings 16 are etched into silicon layer 5, via which, for example, gaseous hydrofluoric acid is able to penetrate and which removes the sacrificial material surrounding functional element 3 by etching. Cavity 2 is formed by the removal of the sacrificial material, and functional element 3 is exposed in the cavity. In the process, in particular a surface area 6 of aluminum nitride layer 4 of functional element 3 inside the cavity is exposed, which in the shown example extends around the lateral circumference of functional element 3 as a closed strip 6.

To form a closed cap, by which resonator 3' in a closed cavity 2 is shielded against outside influences, it is necessary to close openings 16 in a last step using further material. However, if silicon is applied onto surface 17 of structure 1 by epitaxial deposition, the problem arises that the silicon forces its way through openings 16 to aluminum nitride layer 4 (indicated by arrow 13), deposits there, and causes a short circuit between the upper and lower electrodes 9, 10 by overgrowing the exposed aluminum nitride surface area. In the illustrated specific embodiment of the present invention, this problem is solved in that width 7 of exposed surface area 6 is smaller than 2.5 μm. In the present case, width 7 corresponds to the thickness of 1 μm of aluminum nitride layer 4. This dimension ensures that the direct growth of silicon on exposed surface area 6 is heavily suppressed. Due to the selected width, the silicon adsorbed from the gas phase on surface area 6 diffuses to the abutting surface areas of silicon layers 10, 9, without previously nucleating a silicon layer on aluminum nitride surface area 6. Exposed surface area 6 thus grows over considerably more slowly from the edges. The complete overgrowth is thus prevented long enough, so that openings 16 are ultimately closed by the silicon deposited onto surface 17, and the further inflow of silicon to aluminum nitride layer 4 is suppressed.

Figure 2:
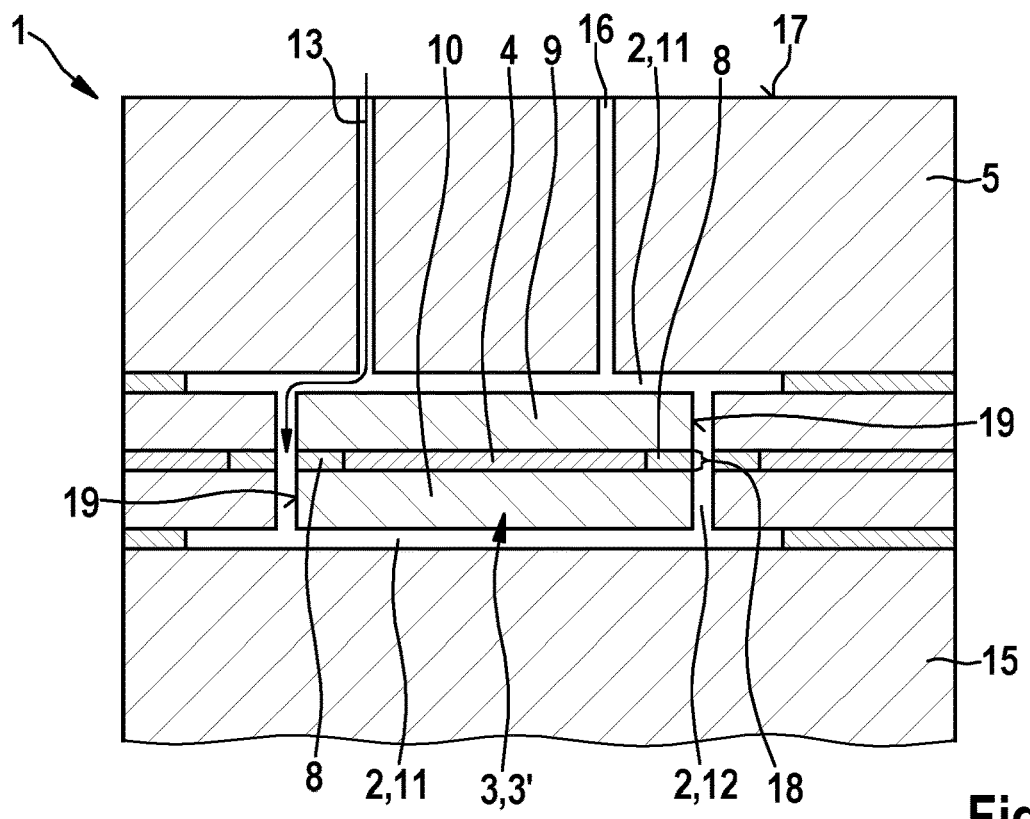
FIG. 2 shows a further specific embodiment of the microelectromechanical structure according to the present invention during the growth of an epitaxial cap layer.

FIG. 2 shows a further specific embodiment of microelectromechanical structure 1 according to the present invention. The microelectromechanical structure again includes a functional element 3 situated in a cavity 2 (for example a resonator 3') which is made up of two silicon layers 10, 9 separated by an aluminum nitride layer 4. As is also shown in FIG. 1, the technical problem during the formation of a cap layer closing cavity 2 is that the silicon deposited on surface 17, as indicated by arrow 13, forces its way through openings 16 to the functional element, and is able to grow there. To prevent that area 18 separating the upper and lower silicon layers 9, 10 at edge 19 of functional element 3 from being overgrown with silicon, and thus causing a short circuit between layers 9, 10, aluminum nitride layer 4 in this specific embodiment is provided with an insulating layer 8, for example made up of silicon oxide, at edge 19 of the functional element. On surface area 18 of insulating layer 8 which is exposed in cavity 2, the direct growth of silicon is sufficiently heavily suppressed, so that the silicon deposited on insulating layer 8 diffuses to the abutting silicon layers 9, 10, and area 18 grows over only slowly from the edges, so that openings 16 are grown over before a short circuit occurs between layers 9, 10.

What is claimed is:

1. A microelectromechanical structure, comprising:
   a functional element situated in a cavity of the microelectromechanical structure, the functional element including an aluminum nitride layer;
   wherein the cavity is closed by a cap layer, the cap layer including epitaxial silicon,
   wherein the aluminum nitride layer includes an insulating layer at an edge of the functional element,
   wherein the functional element includes a first silicon layer and a second silicon layer, the aluminum nitride layer being situated between the first silicon layer and the second silicon layer, and
   wherein the insulating layer separates the upper and lower silicon layers at the edge.

2. The microelectromechanical structure as recited in claim 1, wherein the aluminum nitride layer includes at least one exposed surface area, the exposed surface area being exposed inside the cavity.

3. The microelectromechanical structure as recited in claim 2, wherein the at least one exposed surface area of the aluminum nitride layer has a width of maximally 2.5 μm.

4. The microelectromechanical structure as recited in claim 2, wherein a thickness of the aluminum nitride layer tapers toward an edge of the functional element.

5. The microelectromechanical structure as recited in claim 1, wherein the insulating layer includes silicon oxide and/or silicon nitride and/or silicon-rich nitride.

6. The microelectromechanical structure as recited in claim 1, wherein the aluminum nitride layer is doped with scandium.

7. The microelectromechanical structure as recited in claim 1, wherein the functional element includes at least one further layer, the at least one further layer including a metal and/or a metallic compound and/or a combination of silicon and a metal and/or a combination of silicon and a metallic compound.

8. The microelectromechanical structure as recited in claim 1, wherein the functional element is an electromechanical resonator.

9. A method for manufacturing a micromechanical structure, comprising:
   providing a functional element in a cavity, the functional element including an aluminum nitride layer;
   after the providing, closing the cavity with a cap layer, the cap layer including epitaxial silicon; and
   providing an insulating layer at an edge of the functional element,
   wherein the functional element includes a first silicon layer and a second silicon layer, the aluminum nitride layer being situated between the first silicon layer and the second silicon layer, and
   wherein the insulating layer separates the upper and lower silicon layers at the edge.

\* \* \* \* \*